United States Patent
Ke et al.

(10) Patent No.: US 12,407,303 B2
(45) Date of Patent: Sep. 2, 2025

(54) METHOD AND SYSTEM FOR PRE-COMPENSATING NON-LINEAR DISTORTION IN DATA SAMPLES

(71) Applicant: HUAWEI TECHNOLOGIES CO., LTD., Guangdong (CN)

(72) Inventors: Jianhong Ke, Stittsville (CA); Xuefeng Tang, Kanata (CA); Chuandong Li, Ottawa (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 57 days.

(21) Appl. No.: 18/353,433

(22) Filed: Jul. 17, 2023

(65) Prior Publication Data
US 2025/0030385 A1  Jan. 23, 2025

(51) Int. Cl.
*H03F 1/32* (2006.01)
*H04B 1/04* (2006.01)

(52) U.S. Cl.
CPC ......... *H03F 1/3247* (2013.01); *H04B 1/0475* (2013.01); *H04B 2001/0425* (2013.01)

(58) Field of Classification Search
CPC .............. H03F 1/3247; H04B 1/0475; H04B 2001/0425
USPC ....................................................... 375/296
See application file for complete search history.

(56) References Cited

U.S. PATENT DOCUMENTS

| | | | |
|---|---|---|---|
| 2004/0119534 A1* | 6/2004 | Chandrasekaran | ... H03F 1/3247 330/149 |
| 2009/0129257 A1* | 5/2009 | Maltsev | ............... H03F 1/0205 370/208 |
| 2014/0099128 A1 | 4/2014 | Mateo et al. | |

FOREIGN PATENT DOCUMENTS

| | | |
|---|---|---|
| CN | 102725977 A | 10/2012 |
| WO | 2022156734 A1 | 7/2022 |

* cited by examiner

*Primary Examiner* — Kevin M Burd
(74) *Attorney, Agent, or Firm* — BCF LLP

(57) ABSTRACT

Pre-compensation for linear and non-linear distortion in data symbols comprises generating a set of data symbols to be transmitted and converting the set into a set of frequency-domain samples, which are then pre-processed. Linear distortion compensation is provided, prior to compensating for non-linear distortions, to the pre-processed set of frequency-domain samples. The linear distortion compensated set of frequency-domain samples is converted into a linear distortion compensated set of time domain samples. Non-linear distortion compensation is provided to the linear distortion compensated set of time domain samples. A Pattern Dependent Lookup Table (PDLUT) is generated by receiving consecutive sequences of samples included in a set of time domain samples, quantizing the consecutive sequences of samples into integer-valued consecutive sequences of samples, computing error correction values corresponding to the integer-valued consecutive sequences of samples, and storing the indexes of integer-valued consecutive sequences of samples and the corresponding error correction values in the PDLUT.

12 Claims, 11 Drawing Sheets

METHOD AND SYSTEM FOR PRE-COMPENSATING NON-LINEAR DISTORTION IN DATA SAMPLES

CROSS-REFERENCE TO RELATED APPLICATIONS

This is the first application filed for the instantly disclosed technology.

FIELD OF THE INVENTION

The present disclosure generally relates to the field of communication systems and, in particular, to methods and systems for pre-compensating non-linear distortion in data samples.

BACKGROUND

Generally, communication signals transmitted over wireless, wired, or optical networks are subject to various impairments such as non-linear distortions, especially at high baud speed (or high baud rate). The non-linear distortion includes pattern-dependent distortions with memory introduced by transmitter components such as digital-to-analog convertor (DAC), Radio Frequency (RF) amplifiers, and Mach-Zehnder modulators.

The non-linear distortions are caused by combined non-linear effects from the components of the transmitter, which interacts with the frequency responses of the individual components. The non-linear distortions degrade an amplitude and a phase that are based on a symbol sequence in a signal received by a receiver.

Such non-linear distortions have been recognized as one of the major impairments that limits the transceiver performance, especially for high-order modulation formats at high baud rates. The non-linear distortion typically exhibits a strong dependence on data patterns with a considerable memory length.

Generally, in the transmitters the non-linear distortions are compensated prior to compensating the linear distortions. In some scenarios, such compensation techniques are computationally expensive as they require additional hardware components that affect the performance of the transmitter in terms of power consumption.

Additionally, to compensate the non-linear distortions, conventionally a lookup table (LUT) is generated by calculating distortion correction values corresponding to each symbol sequence in a present sequence of N symbols, and storing each calculated distortion correction value with an associated LUT index. The distortion correction values are dependent upon the specific pattern of the symbol sequence, thus the resulting LUT is also referred to as a Pattern Dependent Lookup Table (PDLUT).

Pattern-dependent lookup table (PDLUT) is an efficient approach for mitigating pattern dependent distortion. The distortion correction values in the PDLUT are obtained based on a calibration process by comparing the data received by the receiver and the transmitted data at the transmitter. Pattern-dependent distortion can be mitigated based on the distortion correction. The PDLUT has achieved a good performance of compensating the transmitter non-linearity at a lower modulation format (for example, 16 QAM), however, with higher modulation (for example, 64QAM) the PDLUT size increases exponentially. This results in complex hardware implementation of the non-linearity compensation system.

With this said, there is an interest in developing system and methods for providing a more efficient pre-compensation configuration for linear and non-linear distortion in data samples.

SUMMARY

The embodiments of the present disclosure have been developed based on developers' appreciation of the limitations associated with the prior art.

The developers have devised a system and a method for pre-compensating non-linear distortion in data samples, as well as a system and a method for generating a Pattern Dependent Lookup Table (PDLUT).

In accordance with a first broad aspect of the present disclosure, there is provided a system for pre-compensating non-linear distortion in data samples, the system comprising: a non-transitory memory element having instructions thereon; at least one processor coupled to the non-transitory memory element and which execute the instructions to cause the at least one processor to: generate a first set of data symbols to be transmitted; convert the first set of data symbols into a first set of frequency-domain samples; pre-process the first set of frequency-domain samples; provide linear distortion compensation, prior to compensating for non-linear distortions, to the pre-processed first set of frequency-domain samples; convert the linear distortion compensated first set of frequency-domain samples into linear distortion compensated first set of time domain samples; and provide non-linear distortion compensation to the linear distortion compensated first set of time domain samples.

In accordance with any embodiments of the present disclosure, the at least one processor is further configured to: generate a second set of data symbols in parallel to the first set of data symbols to be transmitted; convert the second set of data symbols into a second set of frequency-domain samples; pre-process the second set of frequency-domain samples; combine the first set of frequency-domain samples and the second set of frequency-domain samples and generate a frequency-domain sampled DMB or OFDM signal; provide linear distortion compensation, prior to compensating for non-linear distortions, to the frequency-domain sampled DMB or OFDM signal; convert the linear distortion compensated frequency-domain sampled DMB or OFDM signal into linear distortion compensated time-domain sampled DMB or OFDM signal; and provide non-linear distortion compensation to the linear distortion compensated time-domain sampled DMB or OFDM signal.

In accordance with any embodiments of the present disclosure, the non-linear distortion compensation is provided based on a Pattern Dependent Lookup Table (PDLUT).

In accordance with any embodiments of the present disclosure, the PDLUT is generated by the at least one processor by: receiving consecutive sequences of samples included in the linear distortion compensated first set of time domain samples; quantizing the consecutive sequences of samples into integer-valued consecutive sequences of samples; computing error correction values corresponding to the integer-valued consecutive sequences of samples; and storing the indexes of the integer-valued consecutive sequences of samples and the corresponding error correction values in the PDLUT.

In accordance with any embodiments of the present disclosure, quantizing the consecutive sequences of samples includes: clipping the consecutive sequences of samples; determining scaling factors based on quantization levels;

and quantizing the consecutive sequences of samples based on the clipped consecutive sequences of samples and the scaling factors.

In accordance with any embodiments of the present disclosure, computing the error correction values includes: receiving the consecutive sequences of samples received by a receiver; and comparing the consecutive sequences of samples to be transmitted with the received consecutive sequences of samples; and based on a difference between the consecutive sequences of samples to be transmitted and the received consecutive sequences of samples, computing the error correction values.

In accordance with any embodiments of the present disclosure, in the event that more than one integer-valued consecutive sequences of samples are same and have different error correction values, selecting one of the different error correction values.

In accordance with any embodiments of the present disclosure, selecting one of the different error correction values includes one of: randomly selecting one of the different error correction values; and taking an average of the different error correction values.

In accordance with a second broad aspect of the present disclosure, there is provided a method for pre-compensating non-linear distortion in data samples, the method comprising: generating a first set of data symbols to be transmitted; converting the first set of data symbols into a first set of frequency-domain samples; pre-processing the first set of frequency-domain samples; providing linear distortion compensation, prior to compensating for non-linear distortions, to the pre-processed first set of frequency-domain samples; converting the linear distortion compensated first set of frequency-domain samples into linear distortion compensated first set of time domain samples; and providing non-linear distortion compensation to the linear distortion compensated first set of time domain samples.

In accordance with any embodiments of the present disclosure, the method further comprises: generating a second set of data symbols in parallel to the first set of data symbols to be transmitted; converting the second set of data symbols into a second set of frequency-domain samples; pre-processing the second set of frequency-domain samples; combining the first set of frequency-domain samples and the second set of frequency-domain samples and generating a frequency-domain sampled DMB or OFDM signal; providing linear distortion compensation, prior to compensating for non-linear distortions, to the frequency-domain sampled DMB or OFDM signal; converting the linear distortion compensated frequency-domain sampled DMB or OFDM signal into linear distortion compensated time-domain sampled DMB or OFDM signal; and providing non-linear distortion compensation to the linear distortion compensated time-domain sampled DMB or OFDM signal.

In accordance with any embodiments of the present disclosure, the non-linear distortion compensation is provided based on a Pattern Dependent Lookup Table (PDLUT).

In accordance with any embodiments of the present disclosure, the PDLUT is generated by: receiving consecutive sequences of samples included in the linear distortion compensated first set of time domain samples; quantizing the consecutive sequences of samples into integer-valued consecutive sequences of samples; computing error correction values corresponding to the integer-valued consecutive sequences of samples; and storing the indexes of integer-valued consecutive sequences of samples and the corresponding error correction values in the PDLUT.

In accordance with any embodiments of the present disclosure, quantizing the consecutive sequences of samples includes: clipping the consecutive sequences of samples; determining scaling factors based on quantization levels; and quantizing the consecutive sequences of samples based on the clipped consecutive sequences of samples and the scaling factors.

In accordance with any embodiments of the present disclosure, computing the error correction values includes: receiving the consecutive sequences of samples received by a receiver; comparing the consecutive sequences of samples to be transmitted with the received consecutive sequences of samples; and computing the error correction values based on a difference between the consecutive sequences of samples to be transmitted and the received consecutive sequences of samples.

In accordance with any embodiments of the present disclosure, in the event that more than one integer-valued consecutive sequences of samples are same and have different error correction values, selecting one of the different error correction values.

In accordance with any embodiments of the present disclosure, selecting one of the different error correction values includes one of: randomly selecting one of the different error correction values; and taking an average of the different error correction values.

In accordance with a third broad aspect of the present disclosure, there is provided a system for generating a Pattern Dependent Lookup Table (PDLUT), the system comprising: a non-transitory memory element having instructions thereon; at least one processor coupled to the non-transitory memory element and which execute the instructions to cause the at least one processor to: receive consecutive sequences of samples included in a first set of time domain samples; quantize the consecutive sequences of samples into integer-valued consecutive sequences of samples; compute error correction values corresponding to the integer-valued consecutive sequences of samples; and store the indexes of integer-valued consecutive sequences of samples and the corresponding error correction values in the PDLUT.

In accordance with any embodiments of the present disclosure, quantizing the consecutive sequences of samples includes: clipping the consecutive sequences of samples; determining scaling factors based on quantization levels; and quantizing the consecutive sequences of samples based on the clipped consecutive sequences of samples and the scaling factors.

In accordance with any embodiments of the present disclosure, computing the error correction values includes: receiving the consecutive sequences of samples received by a receiver; and comparing the consecutive sequences of samples to be transmitted with the received consecutive sequences of samples; and based on a difference between the consecutive sequences of samples to be transmitted and the received consecutive sequences of samples, computing the error correction values.

In accordance with any embodiments of the present disclosure, in the event that more than one integer-valued consecutive sequences of samples are same and have different error correction values, selecting one of the different error correction values.

In accordance with any embodiments of the present disclosure, selecting one of the different error correction values includes one of: randomly selecting one of the different error correction values; and taking an average of the different error correction values.

In accordance with a fourth broad aspect of the present disclosure, there is provided a method for generating a Pattern Dependent Lookup Table (PDLUT), the method comprising: receiving consecutive sequences of samples included in a first set of time domain samples; quantizing the consecutive sequences of samples into integer-valued consecutive sequences of samples; computing error correction values corresponding to the integer-valued consecutive sequences of samples; and storing the indexes of integer-valued consecutive sequences of samples and the corresponding error correction values in the PDLUT.

In accordance with any embodiments of the present disclosure, quantizing the consecutive sequences of samples includes: clipping the consecutive sequences of samples; determining scaling factors based on quantization levels; and quantizing the consecutive sequences of samples based on the clipped consecutive sequences of samples and the scaling factors.

In accordance with any embodiments of the present disclosure, computing the error correction values includes: receiving the consecutive sequences of samples received by a receiver; comparing the consecutive sequences of samples to be transmitted with the received consecutive sequences of samples; and computing the error correction values based on a difference between the consecutive sequences of samples to be transmitted and the received consecutive sequences of samples.

In accordance with any embodiments of the present disclosure, in the event that more than one integer-valued consecutive sequences of samples are same and have different error correction values, selecting one of the different error correction values.

In accordance with any embodiments of the present disclosure, selecting one of the different error correction values includes one of: randomly selecting one of the different error correction values; and taking an average of the different error correction values.

BRIEF DESCRIPTION OF THE FIGURES

The features and advantages of the present disclosure will become apparent from the following detailed description, taken in combination with the appended drawings, in which.

Figure 1:
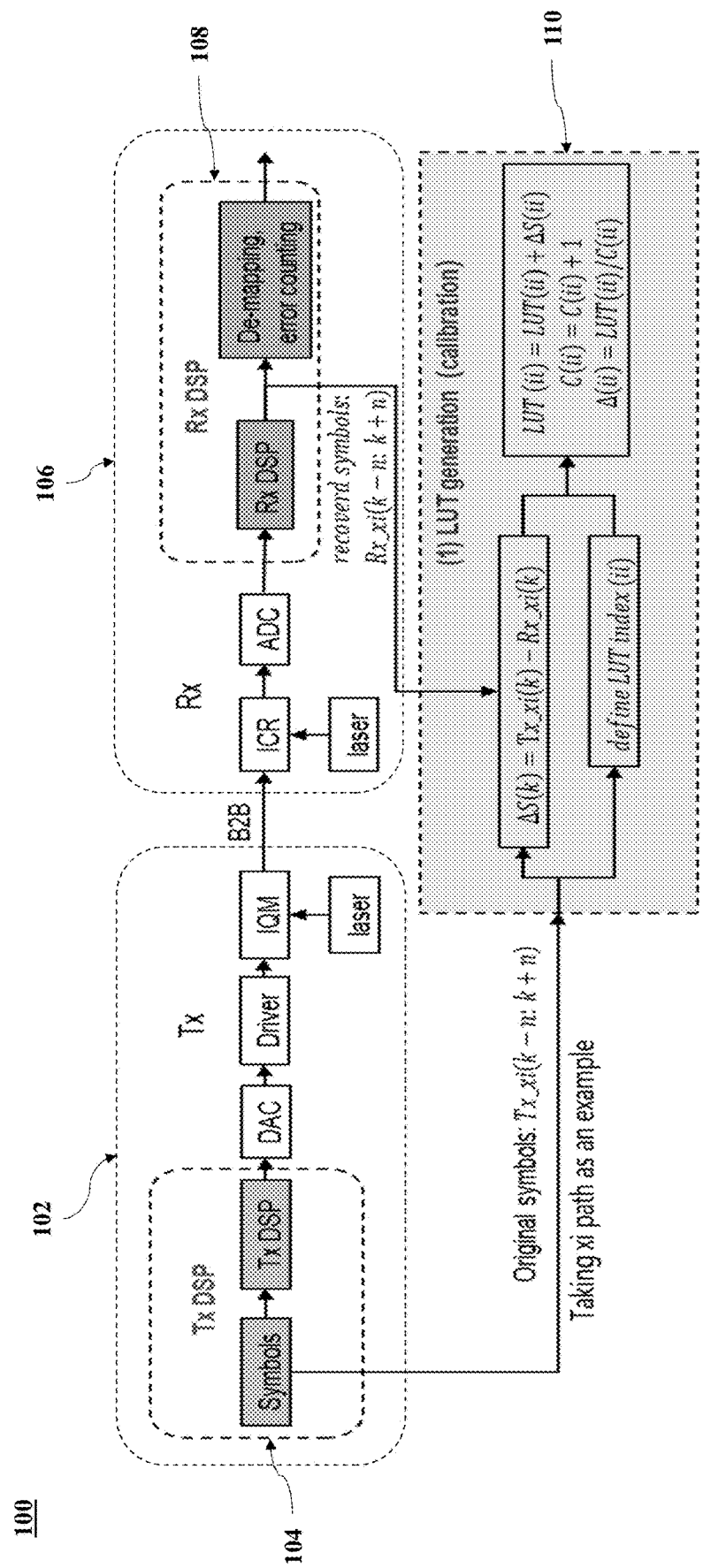
FIG. 1 (Prior Art) depicts a block diagram of conventional transceiver.

It is to be understood that throughout the appended drawings and corresponding descriptions, like features are identified by like reference characters. Furthermore, it is also to be understood that the drawings and ensuing descriptions are intended for illustrative purposes only and that such disclosures are not intended to limit the scope of the claims.

DETAILED DESCRIPTION

The instant disclosure is directed to addressing at least some of the deficiencies of the conventional techniques used to pre-compensate non-linear distortions in data samples.

Unless otherwise defined or indicated by context, all technical and scientific terms used herein have the same meaning as commonly understood by one of ordinary skill in the art to which the described embodiments appertain.

In the context of the present specification, unless provided expressly otherwise, the words "first", "second", "third", etc. have been used as adjectives only for the purpose of allowing for distinction between the nouns that they modify from one another, and not for the purpose of describing any particular relationship between those nouns. Thus, for example, it should be understood that the use of the terms "first processor" and "third processor" is not intended to imply any particular order, type, chronology, hierarchy or ranking (for example) of/between the server, nor is their use (by itself) intended to imply that any "second processor" must necessarily exist in any given situation. Further, as is discussed herein in other contexts, reference to a "first" element and a "second" element does not preclude the two elements from being the same actual real-world element. Thus, for example, in some instances, a "first" processor and a "second" processor may be the same software and/or hardware, in other cases they may be different software and/or hardware.

It will be understood that when an element is referred to as being "connected" or "coupled" to another element, it can be directly or indirectly connected or coupled to the other element or intervening elements that may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In the context of the present specification, when an element is referred to as being "associated with" another element, in certain embodiments, the two elements can be directly or indirectly linked, related, connected, coupled, the second element employs the first element, or the like without limiting the scope of present disclosure.

The terminology used herein is only intended to describe particular representative embodiments and is not intended to be limiting of the present technology. As used herein, the singular forms "a," "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof.

Implementations of the present technology each have at least one of the above-mentioned objects and/or aspects, but do not necessarily have all of them. It should be understood that some aspects of the present technology that have resulted from attempting to attain the above-mentioned object may not satisfy this object and/or may satisfy other objects not specifically recited herein.

The examples and conditional language recited herein are principally intended to aid the reader in understanding the principles of the present technology and not to limit its scope to such specifically recited examples and conditions. It will be appreciated that those skilled in the art may devise various arrangements which, although not explicitly described or shown herein, nonetheless embody the principles of the present technology and are included within its spirit and scope.

Furthermore, as an aid to understanding, the following description may describe relatively simplified implementations of the present technology. As persons skilled in the art would understand, various implementations of the present technology may be of a greater complexity.

In some cases, what are believed to be helpful examples of modifications to the present technology may also be set forth. This is done merely as an aid to understanding, and, again, not to define the scope or set forth the bounds of the present technology. These modifications are not an exhaustive list, and a person skilled in the art may make other modifications while nonetheless remaining within the scope of the present technology. Further, where no examples of modifications have been set forth, it should not be interpreted that no modifications are possible and/or that what is described is the sole manner of implementing that element of the present technology.

Moreover, all statements herein reciting principles, aspects, and implementations of the present technology, as well as specific examples thereof, are intended to encompass both structural and functional equivalents thereof, whether they are currently known or developed in the future. Thus, for example, it will be appreciated by those skilled in the art that any block diagrams herein represent conceptual views of illustrative circuitry embodying the principles of the present technology. Similarly, it will be appreciated that any flowcharts, flow diagrams, state transition diagrams, pseudo-code, and the like represent various processes which may be substantially represented in computer-readable media and so executed by a computer or processor, whether or not such computer or processor is explicitly shown.

The functions of the various elements shown in the figures, including any functional block labeled as a "processor" or a "processing unit", may be provided through the use of dedicated hardware as well as hardware capable of executing software in association with appropriate software. When provided by a processor, the functions may be provided by a single dedicated processor, by a single shared processor, or by a plurality of individual processors, some of which may be shared. In some embodiments of the present technology, the processor may be a general-purpose processor, such as a central processing unit (CPU) or a processor dedicated to a specific purpose, such as a graphics processing unit (GPU). Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read-only memory (ROM) for storing software, random access memory (RAM), and non-volatile storage. Other hardware, conventional and/or custom, may also be included.

Software modules, modules, or units which are implied to be software, may be represented herein as any combination of flowchart elements or other elements indicating performance of process steps and/or textual description. Such modules may be executed by hardware that is expressly or implicitly shown.

As used herein, the term "about" or "approximately" refers to a +/−15% variation from the nominal value. It is to be understood that such a variation is always included in a given value provided herein, whether or not it is specifically referred to.

With these fundamentals in place, the instant disclosure is directed to address at least some of the deficiencies of the current technology. In particular, the instant disclosure describes systems and methods to efficiently pre-compensate the non-linear distortions in the data samples.

Referring now to the drawings, FIG. 1 (Prior Art) depicts a block diagram of conventional transceiver 100. The transceiver 100 includes a transmitter 102 and a receiver 106. The transceiver 100 may be included in any type of communication system such as, for example, wired communication systems, wireless communication systems, and optical communication systems.

The transmitter 102 is a coherent transmitter and includes 4 independent data paths. Each data path is associated with the xi, xq, yi and yq data. The data paths propagate through the transmitter 102 before being modulated on laser output. The transmitter 102 includes a transmitter digital signal processor (DSP) 104 configured to process the data symbols and transmit over the communication channel. The receiver 106 includes a receiver DSP 108 configured to process and recover the transmitted data symbols.

It is contemplated that the conventional transceiver 100 includes components such as digital-to-analog convertor (DAC), Radio Frequency (RF) amplifiers, and Mach-Zehnder modulators, analog-to digital convertors (ADC) that may contribute to the non-linear distortions to the symbols propagating on different data paths. Generally, the non-linear distortions for different data paths are calibrated and compensated separately. For the purpose of simplicity, the xi, path has been taken as an example.

The conventional transceiver 100 further includes a look up table (LUT) generator 110 configured to generate a LUT for pre-compensation of the data samples to mitigate or reduce the effect of non-linear distortions. The LUT table may include distortion correction values corresponding to each data symbol. Typically, the distortion correction values are dependent upon the specific pattern of the symbol sequence, thus the resulting LUT is also referred to as a Pattern Dependent Lookup Table (PDLUT).

The LUT generator 110 generates the PDLUT by comparing the ideal transmitted symbols Tx_xi with the received samples Rx_xi after linear compensation by the receiver DSP 108. The PDLUT contains the required amplitude correction ΔS for the center symbol within each possible symbol sequence Tx_xi(k−n:k+n) of length m=2n+1. By way of example, if the symbol sequence length is 5, ΔS corresponds to the third symbol in the symbol sequence.

A sliding window is used to identify the 2n+1 ideal symbol sequence to form the address of the table. The amplitude correction for the center symbol ΔS(k) is the difference between the symbol value Tx_xi(k) and the actual sample value Rx_xi(k) (i.e., ΔS(k)=Tx_xi(k)−Rx_xi (k)). As the window moves forward, each time a specific symbol sequence appears, the amplitude correction is accumulated at the corresponding PDLUT entry. A PDLUT counter (C) is used to track the number of updates for each specific entry. The average correction is saved for the final PDLUT.

Figure 2:
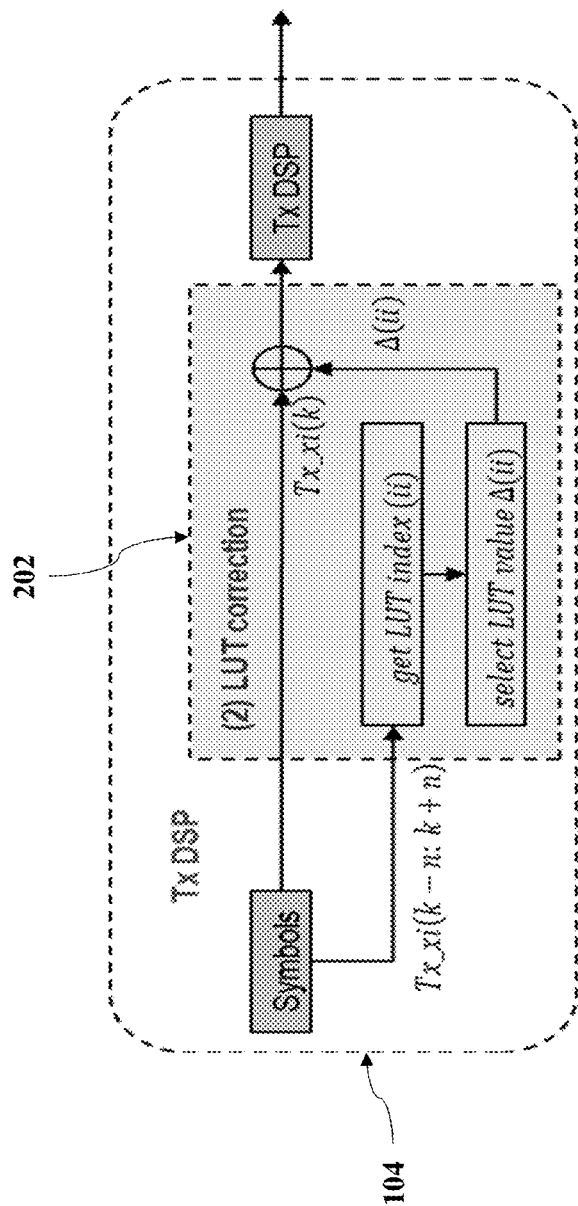
FIG. 2 (Prior Art) illustrates a conventional data symbol correction technique implemented over a transmitter digital signal processor (DSP)

Once the PDLUT is generated, the data symbol values may be corrected based on the distortion correction values. FIG. 2 (Prior Art) illustrates a conventional data symbol correction technique 200 implemented over the transmitter DSP 104. The transmitter 102 includes a data symbol corrector 202 configured to select the appropriate distortion correction values from the PDLUT and apply the distortion correction to the data symbols.

More particularly, the transmitter DSP 104 relies on the same sliding window as used by the LUT generator 110 to identify the 2n+1 ideal symbol sequence to get the address (ii). The distortion correction Δ(ii) in the specific address is applied to the center symbol of the 2n+1 ideal symbol sequence Tx_xi(k−n:k+n).

Even though, PDLUT has been illustrated a good performance of compensating the transmitter non-linearity, the PDLUT size increases exponentially with modulation formats. With a memory length of m, PDLUT size of 16QAM is $4^m$, while for 64QAM, the size is increased to $8^m$. PDLUT is quite large to be implemented for 64QAM and higher modulation format, thereby increases the hardware complexity and the associated power consumption.

Figure 3:
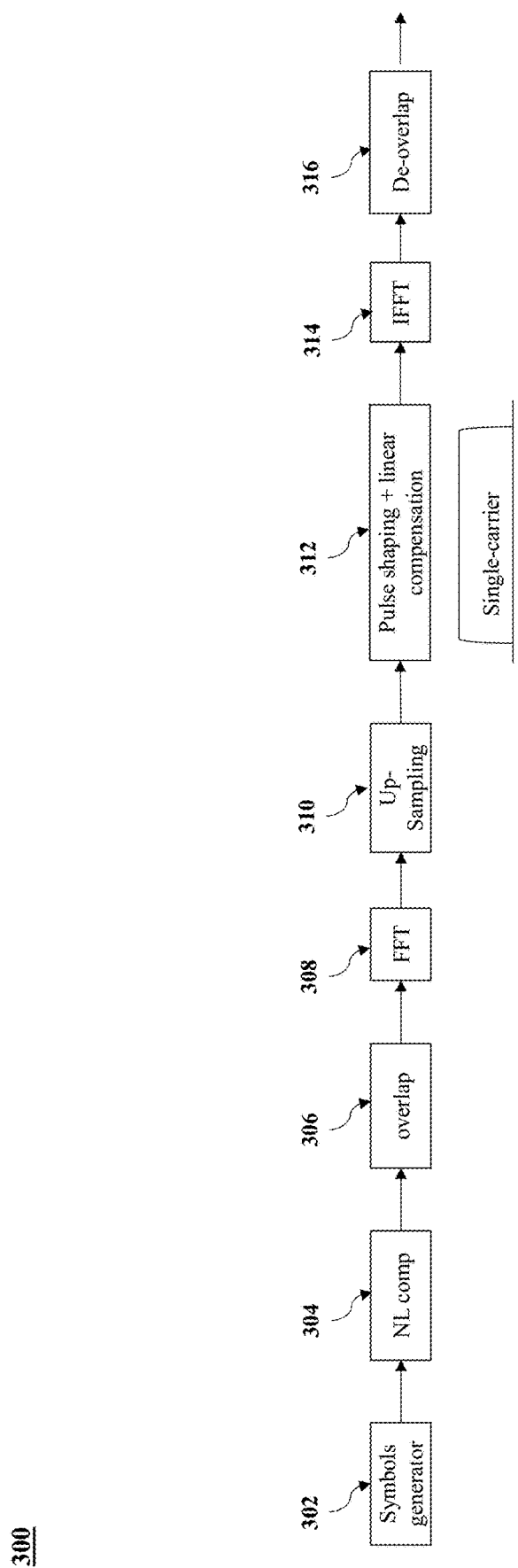
FIG. 3 (Prior Art) illustrates a high-level functional block diagram of components included in a transmitter digital signal processor (DSP) in a single-carrier system.

FIG. 3 (Prior Art) illustrates a high-level functional block diagram of components included in a transmitter DSP 300 in a single-carrier system. As shown, the transmitter DSP 300 includes a symbol generator 302, a non-linear compensator 304, an overlap module 306, a Fast Fourier Transform (FFT) module 310, an up-sampling module 310, a pulse shaper and linear compensator 312, an inverse FFT (IFFT) module 314 and a de-overlap module 316. The symbol generator 302 generates symbols to be transmitted. The non-linear compensator 304 pre-compensates the symbols to reduce the effect of non-linear distortions to be added by various components down the line. The overlap module 306 performs overlap method on the pre-compensated symbols. The FFT module 308 converts the pre-compensated symbols to frequency samples. The up-sampling module 310 up-samples the frequency samples. The pulse shaper and linear compensator 312 performs pulse shaping and provides a linear compensation to the up-sampled frequency samples. The IFFT module 314 converts the frequency samples back to compensated symbols. The de-overlap module 316 reverses the overlap method and the symbols are ready for further processing.

Figure 4:
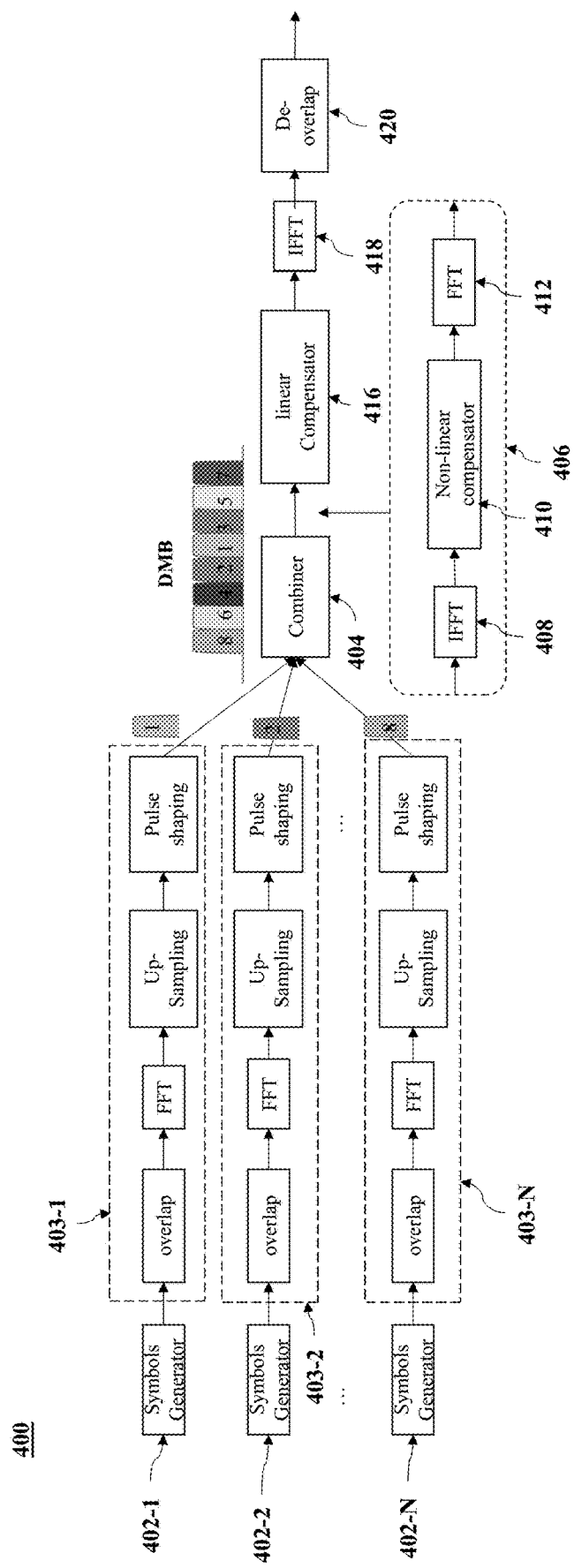
FIG. 4 (Prior Art) illustrates a high-level functional block diagram of components included in a transmitter DSP in a digital multiband (DMB) system.

FIG. 4 (Prior Art) illustrates a high-level functional block diagram of components included in a transmitter DSP 400 in a digital multiband (DMB) system. As shown the transmitter DSP 400 includes multiple symbol generators 402-1, 402-2 . . . 402-N, multiple preprocessors 403-1, 403-2, . . . 403-N, a combiner 404, a non-linear compensator 406, a linear compensator 416, an IFFT module 418, and a de-overlap module 420. The symbol generators 402-1, 402-2, . . . 402-N generates symbols in parallel to be transmitted. Each one of the preprocessors 403-1, 403-2 . . . 403-N may be configured to perform standard operations such as overlapping, converting the respective symbols to frequency samples, up-sampling, and pulse shaping. After pre-processing the symbols, each one of the preprocessors 403-1, 403-2, . . . 403-N may forward the respective frequency samples to the combiner 404. The combiner 404 combines the frequency samples from each one of the preprocessors 403-1, 403-2 . . . 403-N to generate a DMB signal.

The non-linear compensator 406 pre-compensates the DMB signal to reduce the effect of non-linear distortions. The non-linear compensator 406 includes an IFFT module 408, a non-linear compensator 410, and an FFT module 412. The IFFT module 408 converts the frequency-domain DMB signal to time-domain DMB signal. The non-linear compensator 410 performs non-linear compensation of the time-domain DMB signal. The FFT module 412 converts the pre-compensated time-domain DMB signal to pre-compensated frequency-domain DMB signal.

The linear compensator 416 compensates for the linear distortions in the DMB signal. The IFFT module 418 converts the pre-compensated frequency-domain DMB signal to pre-compensated time-domain DMB signal. The de-overlap module 420 reverses the overlap method.

To compensate the non-linear distortion in the transmitter DSP 400, the frequency-domain DMB signal is required to be converted to the time domain, pre-compensated for non-linear distortions, and then again converting the pre-compensated time-domain DMB signal to the frequency domain again for linear compensation. Such non-linear compensation techniques where the non-linear distortions are pre-compensated prior to the linear distortions requires additional components such as the IFFT module 408, and the FFT module 412. Moreover, these additional components require additional power to operate.

It is to be noted that in transmitter devices, the linear and non-linear distortions are distributed in alternate arrangement along the waveguide. In order to make digital compensation easier, the distortion distribution (linear as well as non-linear) is usually statistically simplified to a linear model and a non-linear model. In general, there may be two ways by which the distortions may take place in the waveguide. In the first way, the linear distortions may happen after the non-linear distortions. The first way may be referred to as "Linear+NL" model. In the second way, the non-linear distortions may happen after the linear distortions. The second way may be referred to as "NL+Linear" model.

The Linear+NL model may be described by equation (1), where $S_{in}(t)$ may be the input signal, $h_{in}(t)$ may be the linear response, and $\Delta P_{NL}$ is the non-linear error.

$$S(t) = h_{in}(t) \otimes S_{in}(t) + \Delta P_{NL} \qquad (1)$$

The digital pre-compensation may be represented as equation (2), where $S_0(t)$ may be the original signal, $h_{in}(t)$ may be the linear pre-distortion, $\Delta_{NL}(t)$ may be the calibrated non-linear error, which is very close to $\Delta P_{NL}$.

$$S_{comp}(t) = h_{in}^{-1}(t) \otimes (S_0(t) - \Delta_{NL}(t)) \qquad (2)$$

Then, by substituting equation (2) into equation (1), it may be observed that after pre-distortion, the linear and non-linear distortions may be eliminated. The equation (1) may be rewritten as equation (3).

$$S(t) = h_{ln}(t) \otimes S_{comp}(t) + \Delta P_{NL} \approx S_0(t) \quad (3)$$

Similarly, the NL+Linear model may be described by equation (4), where $\Delta P'_{NL}$ may be the non-linear error in this case.

$$S(t) = h_{ln}(t) \otimes (S_{in}(t) + \Delta P'_{NL}) = h_{ln}(t) \otimes S_{in}(t) + h_{ln}(t) \otimes \Delta P'_{NL} \quad (4)$$

By comparing equation (1) and (4), it may be observed that the non-linear error in the two models may be represented by equation (5).

$$\Delta P_{NL} = h_{ln}(t) \otimes \Delta P'_{NL} \quad (5)$$

The pre-distortion may be represented by equation (6), where $\Delta'_{NL}(t)$ may be the calibrated non-linear error in this case.

$$S_{comp}(t) = h_{ln}^{-1}(t) \otimes S_0(t) - \Delta'_{NL}(t) \quad (6)$$

By substituting equation (6) into equation (5), it may be observed that after pre-distortion, the linear and non-linear distortions may also be eliminated. The equation (5) may be rewritten as equation (7).

$$S(t) = h_{ln}(t) \otimes (S_{comp}(t) + \Delta P'_{NL}) \approx S_0(t) \quad (7)$$

From equation (3) and equation (7), it may be apparent that the two models are mathematically equivalent to each other. Typically, the Linear+NL" model is considered for modeling the distortion compensation and linear compensators are placed after the non-linear compensators in single-carrier, DMB and OFDM systems. Contrary to the typical techniques of linear and non-linear distortion compensations, various embodiments of the present disclosure are directed towards compensating the linear distortions prior to compensating non-linear distortions.

Figure 5:
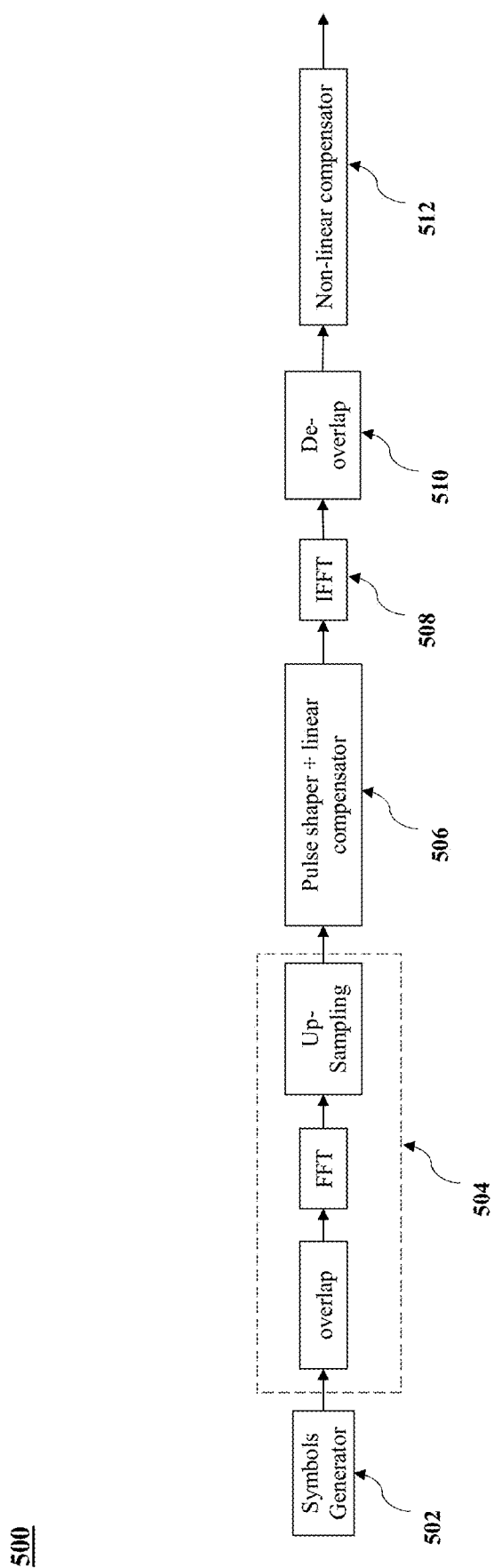
FIG. 5 illustrates a high-level functional block diagram of components included in a modified transmitter DSP in a single-carrier system, in accordance with various non-limiting embodiments of the present disclosure.

FIG. 5 illustrates a high-level functional block diagram of components included in a modified transmitter DSP 500 in a single-carrier system, in accordance with various non-limiting embodiments of the present disclosure. As shown, the modified transmitter DSP 500 may include a symbol generator 502, a preprocessor 504, a pulse shaper and linear compensator 506, an IFFT module 508, a de-overlap module 510, and a non-linear compensator 512. The modified transmitter DSP 500 may include a variety of other suitable components, however, such components have been omitted from FIG. 5 for the purpose of simplicity.

The symbol generator 502 may be configured to generate symbols to be transmitted. The preprocessor 504 may be configured to pre-process the generated symbols. In some embodiments, the preprocessor 504 may apply an overlap technique on the generated symbols. The preprocessor 504 may convert the symbols to frequency-domain samples and may perform up-sampling of the frequency-domain samples. It is to be noted that in the transmitter DSP 500, the generated symbols are not non-linearly compensated.

The pulse shaper and linear compensator 506 may be configured to perform pulse shaping of the frequency-domain samples and may perform linear compensation to pre-compensate for linear distortions that may affect the frequency-domain samples during propagation. It is to be noted that how the pulse shaper and linear compensator 506 pre-compensates the linear distortions should not limit the scope of the present disclosure. By way of example, the linear compensator may, for example and without limitation, be based on frequency response pre-compensation, IQ skew pre-compensation, and the like.

The IFFT module 508 may be configured to convert the linear distortion compensated frequency-domain samples to time-domain samples. The de-overlap module 510 reverses the overlap method and the time-domain samples are ready for further processing.

The non-linear compensator 512 may be configured to perform non-linear compensations over the time-domain samples to pre-compensate the non-linear distortions. It is to be noted that how the non-linear compensator 512 pre-compensates the non-linear distortions should not limit the scope of the present disclosure. By way of example, the non-linear compensator may, for example and without limitation, be based on Volterra pre-distortion, PDLUT pre-distortion method, machine learning methods, and the like.

Figure 6:
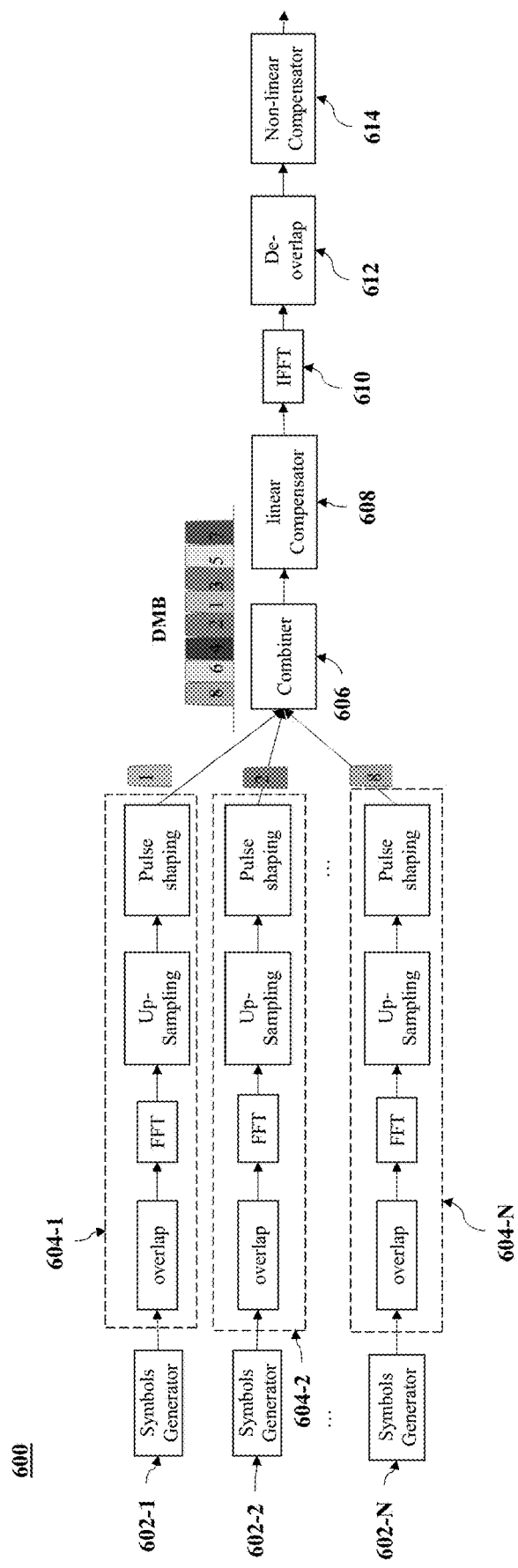
FIG. 6 illustrates a high-level functional block diagram of components included in a modified transmitter DSP in a DMB system, in accordance with various non-limiting embodiments of the present disclosure.

FIG. 6 illustrates a high-level functional block diagram of components included in a modified transmitter DSP 600 in a DMB system, in accordance with various non-limiting embodiments of the present disclosure. As shown, the modified transmitter DSP 600 may include a plurality of symbol generators 602-1, 602-2 . . . 602-N, a plurality of preprocessors 604-1, 604-2, . . . 604-N, a combiner 606, a linear compensator 608, an IFFT module 610, a de-overlap module 612, and a non-linear compensator 614. The modified transmitter DSP 600 may include other suitable components, however, such components have been omitted from FIG. 6 for the purpose of simplicity. Although the present description of FIG. 6 illustrates an embodiment of a DMB system, an orthogonal frequency division multiplex (OFDM) system handling OFDM signals is also contemplated. The present disclosure mainly refers to DMB systems and to DMB signals for simplicity purposes and without limiting the applicability of the present teachings to OFDM systems and OFDM signals.

The symbol generators 602-1, 602-2 . . . 602-N may generate symbols in parallel to be transmitted and may provide the generated symbols to the respective preprocessors 604-1, 604-2, . . . 604-N. Each one of the preprocessors 604-1, 604-2 . . . 604-N may be configured to perform standard operations such as overlapping, converting the respective symbols to frequency samples, up-sampling, and pulse shaping. After pre-processing the symbols, each one of the preprocessors 604-1, 604-2 . . . 604-N may forward the respective frequency samples to the combiner 606. The combiner 606 may combine the frequency samples from each one of the preprocessors 604-1, 604-2 . . . 604-N to generate a frequency-domain sampled DMB signal or, in another embodiment, a frequency domain sampled OFDM signal.

The combiner 606 may forward the frequency-domain sampled DMB signal to the linear compensator 608. The linear compensator 608 may perform linear compensation to pre-compensate for linear distortions that may affect the frequency-domain sampled DMB signal during propagation.

As previously noted, the linear compensator 608 may rely on other suitable techniques such as, for example and without limitation, frequency response pre-compensation, IQ skew pre-compensation, and the like.

The linear compensator 608 may provide the linear distortion compensated frequency-domain sampled DMB signal to the IFFT module 610. The IFFT module 610 may be configured to convert the linear distortion compensated frequency-domain sampled DMB signal into time-domain sampled DMB signal.

The IFFT module 610 may provide the time-domain sampled DMB signal to the de-overlap module 612. The de-overlap module 420 reverses the overlap method and provides the de-overlapped time-domain sampled DMB signal to the non-linear compensator 614.

The non-linear compensator 614 may be configured to pre-compensates the de-overlapped time-domain sampled DMB signal to reduce the effect of non-linear distortions. As previously noted, the non-linear compensator 614 may rely on any suitable techniques such as, for example and without limitation, Volterra pre-distortion, PDLUT pre-distortion method, machine learning methods, and the like. Since the DMB signal is already in the time domain, the technique of performing linear compensation prior to the non-linear compensation may eliminate the requirement of additional IFFT-FFT pair, thereby reducing the requirement of additional hardware components and improves the performance in terms of power requirement.

In some embodiments, the non-linear compensator 614 may rely on PDLUT technique to pre-compensate the non-linear distortions.

It is to be noted that the number of samples in the DMB signal may be significantly large and resulting in even larger number of possible sample combinations. To which, a size of the PDLUT may increase exponentially. Known ASIC chips cannot store such a large PDLUT. With this said, there is a further interest in developing a technique to reduce the size of PDLUT while maintaining the performance of the PDLUT to reduce the effect of the non-linear distortions.

Figure 7:
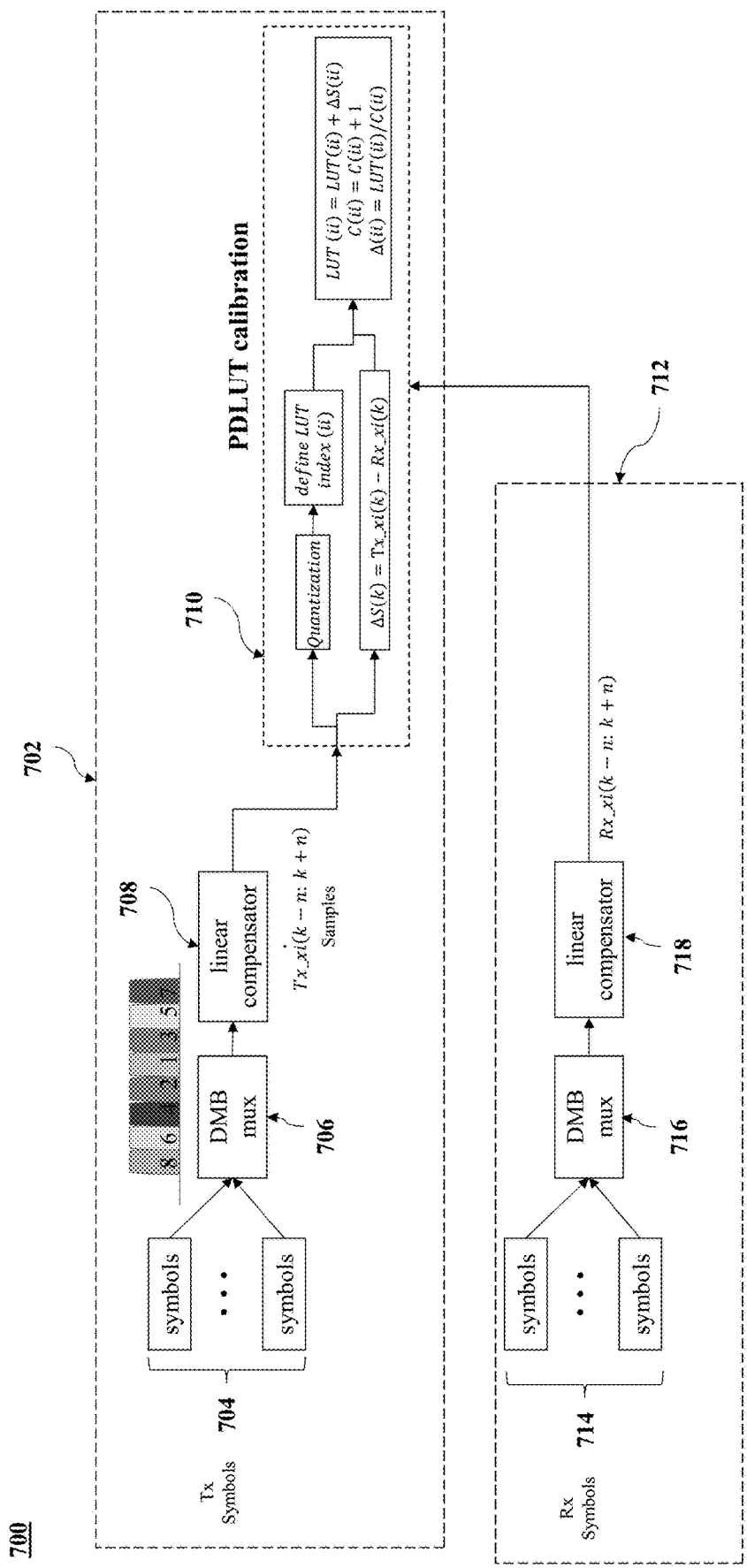
FIG. 7 illustrates a transceiver configured to pre-compensate time-domain sampled DMB signal based on compressed pattern-dependent lookup table (PDLUT), in accordance with various non-limiting embodiments of the present disclosure.

FIG. 7 illustrates a transceiver 700 configured to pre-compensate the time-domain sampled DMB signal based on compressed PDLUT, in accordance with various non-limiting embodiments of the present disclosure. The transceiver 700 may include transmitter 702 and a receiver 712. In case the transceiver 700 is a DMB system (or, alternatively, an OFDM system), the transmitter 702 may generate a plurality of transmitter symbols 704 in parallel to be transmitted. The transmitter 702 may include a DMB multiplexer 706 (or, alternatively, an OFDM multiplexer) to combine the plurality of transmitter symbols 704 to generate a combined DMB signal. The transmitter 702 may further include a linear compensator 708. The linear compensator 708 may be configured to pre-compensate the combined DMB signal for the linear distortions. The transmitter 702 may further include a PDLUT based non-linear compensator 710 placed after the linear compensator 708. The PDLUT based non-linear compensator 710 may be configured to pre-compensate the linear distortion compensated combined DMB signal for the non-linear distortions.

The receiver 712 may be configured to receive the samples transmitted by the transmitter 702. The received samples may be represented as a plurality of received symbols 714. The receiver 712 may include a DMB multiplexer 716 (or, alternatively, an OFDM demultiplexer) configured to combine the plurality of received symbols 714 to generate combined received DMB signal. The receiver 712 may further include a linear compensator 718. The linear compensator 718 may be configured to compensate the combined received DMB signal for the linear distortions.

It is to be noted the PDLUT based non-linear compensator 710 may require calibration prior to begin the non-linear distortion compensations. During the calibration stage, the PDLUT based non-linear compensator 710 may be configured to generate error correction values required to correct the under corrected samples in the linear distortion compensated combined DMB signal. As noted previously, that the number of samples in the DMB signal may be significantly large and resulting in even larger number of possible sample combinations, to reduce the size of PDLUT, various non-limiting embodiments of the present disclosure rely on quantization of the samples.

To initially calibrate, the PDLUT based non-linear compensator 710 may be configured to receive samples Tx_xi (k−n:k+n) of length m=2n+1 pre-compensated by the linear compensator 708. The received samples may be integer or non-integer values. By way of example, a length of the received samples may be equal to three and the three samples may have values of 1.25, 1.89, and 2.19. The sample value 1.25 may be left to the under-corrected sample, 1.89 may be the under corrected sample that may require corrections, and the sample value 2.19 may be right to the under-corrected sample. The PDLUT based non-linear compensator 710 may be configured to quantize the received samples. For example, the sample value 1.25 may be quantized to 1, the sample value 1.89 may be quantized to 2, and the sample value 2.19 may be quantized to 2.

Thus, by virtue of quantization, numerous similar patterns may be classified to one pattern and may share the same error correction value. An input to the quantization block in the PDLUT based non-linear compensator 710 may be the decimal samples, while the output may be integer values. The Quantization block may be configured to perform scaling of the decimal samples. The quantization levels in the quantization block may be an odd number or even number. For odd-number levels, the quantization method may be as follows:

$$sClip = \max(\min(sig, q\text{Max}), q\text{Min}) \quad (8)$$

$$scaleFactor = \frac{q\text{Max} - q\text{Min}}{Nlevel - 1} \quad (9)$$

$$sQuan = \text{round}\left(\frac{sClip}{scaleFactor}\right) \quad (10)$$

where [qMin, qMax] may be the quantization range, which may be a little smaller than the sample range and sig is the value of the sample. A preferable quantization range may be obtained for example, by blind searching. The quantization block may first clip the sample values in accordance with equation (8). The quantization block may obtain a scale factor in accordance with equation (9), where Nlevel is the number of quantization levels. To obtain a quantized value, the quantization block may divide the clipped sample value with the scale factor and may take a round value. The rounded value as represented by equation (10) may represent the quantized value.

In the case of even-number levels, the quantization method is as follows:

$$scaleFactor = \frac{q\text{Max} - q\text{Min}}{2(Nlevel - 1)} \quad (11)$$

$$sQuan = \text{round}\left(\frac{\frac{sClip}{scaleFactor} - 1}{2}\right) \times 2 + 1 \quad (12)$$

Further, corresponding to the quantized samples, the PDLUT based non-linear compensator 710 may define an index of the PDLUT as LUT (ii). The index LUT (ii) may include the quantized samples. Additionally, the PDLUT based non-linear compensator 710 may be configured to receive samples Rx_xi(k−n:k+n) of length m=2n+1 corresponding to the linear distortion compensated combined received DMB signal. The PDLUT based non-linear compensator 710 may generate an error value ΔS(k) from the transmitted samples Tx_xi(k−n:k+n) and the received samples Rx_xi(k−n:k+n). In one example, the error value ΔS(k) may be based on a difference between the transmitted samples Tx_xi(k−n:k+n) and the received samples Rx_xi(k−n:k+n). The error value ΔS(k) may be represented as ΔS(k)=Tx_xi(k)−Rx_xi(k)). Based on the determined quantized samples and the associated error values, the PDLUT based non-linear compensator 710 may be configured to update the PDLUT.

In certain scenarios, more than one pattern of samples may be quantized to same pattern samples. In one example, a first pattern of samples to be transmitted may have values of 1.25, 1.89, and 2.19. Taking a simplified example for explanation purposes, suppose that the scaling factor is 1 and the quantization level is an odd number, the corresponding quantized pattern of samples may be equal to 1, 2, and 2. The corresponding received pattern of samples may be equal to 1.35, 1.93, and 2.25. The error value ΔS(k) may be equal to −0.04. In another example, a second pattern of samples to be transmitted may have values of 1.75, 2.01, and 2.11. Suppose again that the scaling factor is 1 and the quantization level is an odd number, the corresponding quantized pattern of samples may be equal to 1, 2, and 2. The corresponding received pattern of samples may be equal to 1.81, 1.98, and 2.15. The error value ΔS(k) in this example may be equal to 0.03. In such scenarios, where there may be multiple error values corresponding to a given quantized pattern of sample, the PDLUT based non-linear compensator 710 may select a suitable value from the multiple error values. In one example, the PDLUT based non-linear compensator 710 may select any one value from the multiple error values. In another example, the PDLUT based non-linear compensator 710 may take an average value (e.g., mean, median, or mode) of the multiple error values. Generally speaking, if the quantization level is an even number, such as 8 for example, the quantized samples should be ∈{±1, ±3, ±5, ±7}. In contrast, if the quantization level is an odd number, such as 9 for example, the quantized samples should be ∈{0, ±1, ±2, ±3, ±4}.

Figure 8:
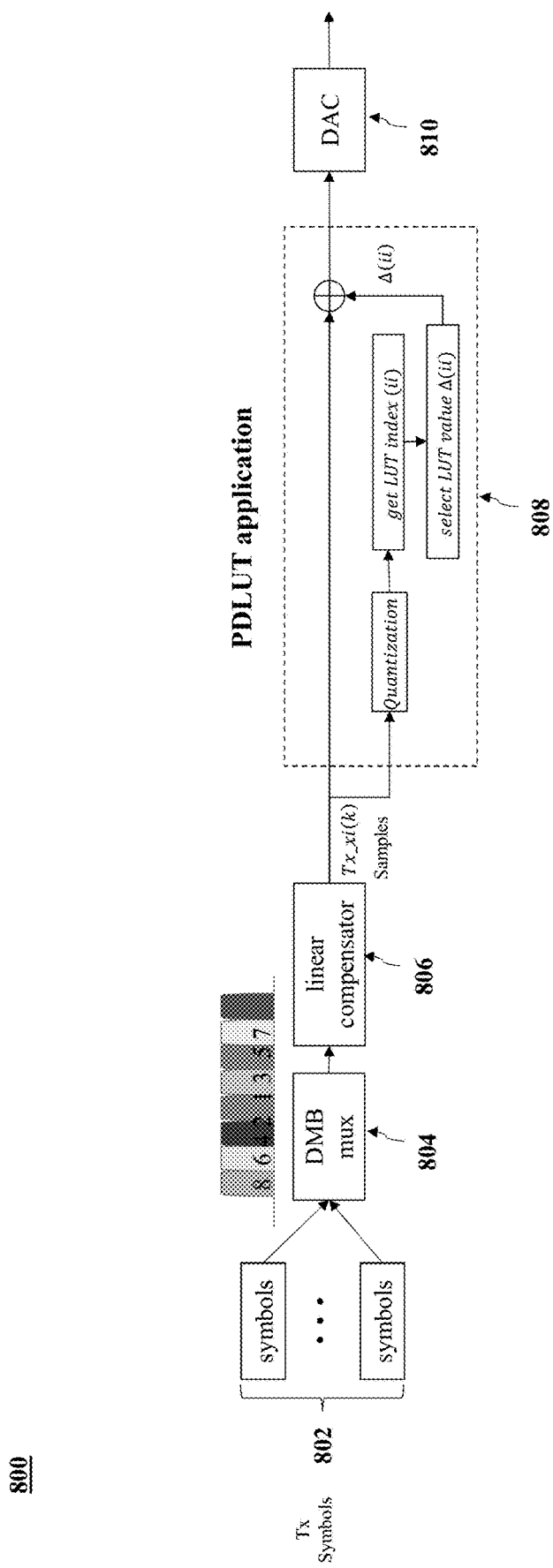
FIG. 8 illustrates a high-level functional block diagram of a transmitter employing the quantized and calibrated PDLUT, in accordance with various embodiments of the present disclosure.

Once the PDLUT is calibrated, the PDLUT based non-linear compensator 710 may employ the quantized and calibrated PDLUT for non-linear distortion corrections. FIG. 8 illustrates a high-level functional block diagram of a modified transmitter DSP 800 employing the quantized and calibrated PDLUT, in accordance with various embodiments of the present disclosure. As shown, the modified transmitter DSP 800 may generate a plurality of transmitter symbols 802 in parallel to be transmitted. The modified transmitter DSP 800 may include a DMB multiplexer 804 (or, alternatively, an OFDM multiplexer) to combine the plurality of transmitter symbols 802 to generate a combined DMB signal. The modified transmitter DSP 800 may further include a linear compensator 806. The linear compensator 806 may be configured to pre-compensate the combined DMB signal for the linear distortions. The modified transmitter DSP 800 may further include a PDLUT based non-linear compensator 808 placed after the linear compensator 708. The PDLUT based non-linear compensator 808 may be configured to pre-compensate the linear distortion compensated combined DMB signal for the non-linear distortions.

The PDLUT based non-linear compensator 808 compensates quantized sample values by using the calibrated PDLUT. The quantization block included in the PDLUT based non-linear compensator 808 may be configured to receive the samples to be compensated and to quantize the sample. Based on the quantized samples, the PDLUT based non-linear compensator may extract an error correction value corresponding to the under-corrected sample, for example, the middle sample in the received pattern. The PDLUT based non-linear compensator 808 may be configured to add the error correction value to the under-corrected sample.

The modified transmitter DSP 800 may further include a digital to analog convertor 810 configured to convert the samples to the analog domain and prepare the samples for transmission.

It is to be noted that the sample-domain PDLUT is not limited to the conventional PDLUT. The method of quantization of the samples may be equally applicable to various other PDLUT generation techniques. Such techniques may include but are not limited to cascaded PDLUT, PDLUT with symmetry and unification, or any other kinds of PDLUTs.

Further, it has been observed experimentally and via simulations that for a SNR using various techniques discussed in the present disclosure may be significantly improved. Additionally, a significant amount of reduction in power consumption may be observed.

Figure 9:
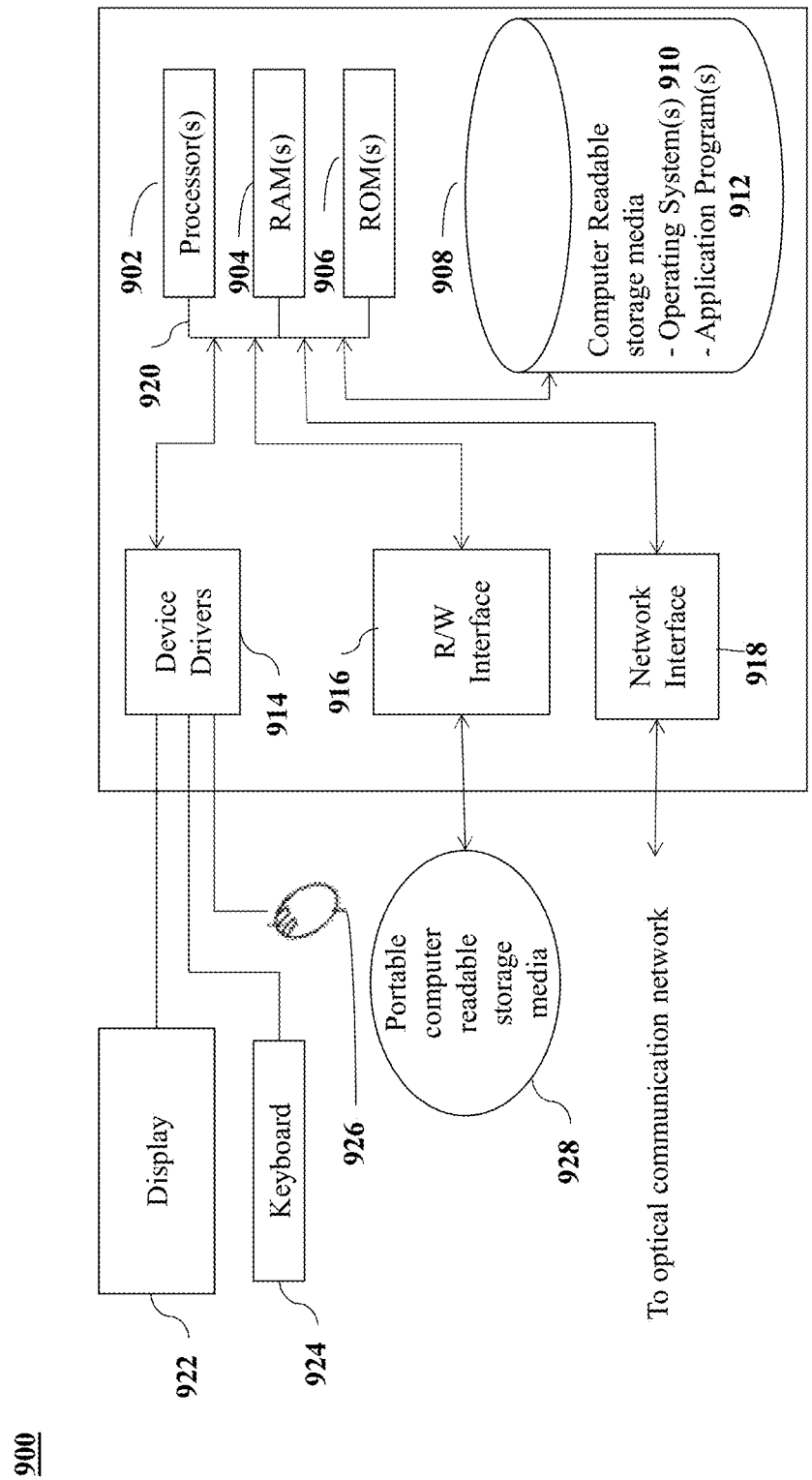
FIG. 9 depicts a high-level block diagram of representative components for a modified transmitter DSP, in accordance with various embodiments of the present disclosure.

FIG. 9 depicts a high-level block diagram of representative components for a modified transmitter DSP 900, in accordance with various embodiments of the present disclosure. It should be appreciated that FIG. 9 provides only an illustration of one implementation of the modified transmitter DSP 900 and does not imply any limitations with regard to the environments in which different embodiments may be implemented. Many modifications to the depicted environment can be done to implement the modified transmitter DSP 900 without departing from the principles presented herein.

It is to be noted that various modified transmitter DSPs for example 500, 600, and 800 discussed in the present disclosure may be implemented similar to the modified transmitter DSP 900 without limiting the scope of present disclosure.

As shown, the modified transmitter DSP 900 employs one or more processors 902, one or more computer-readable random-access memories (RAMs) 904, one or more computer-readable read only memories (ROMs) 906, one or more computer-readable storage media 908, device drivers 914, a read/write (R/W) interface 916, a network interface 918, all interconnected over a communications fabric 920. Communication fabric 920 may be implemented with any architecture designed for passing data and/or control information between processors (such as microprocessors, communication and network processors, etc.), memory, peripheral devices, and any other hardware components within a system.

One or more operating system(s) 910 and one or more application program(s) 912 containing instructions stored on a non-transitory memory element, such as one or more of computer-readable storage media 908, for execution by one or more of the processors 902 via one or more of the respective RAMs 904 (which typically include a cache memory). In the illustrated embodiment, each of computer-readable storage media 908 may be a magnetic disk storage device of an internal hard drive, CD-ROM, DVD, memory stick, magnetic tape, magnetic disk, optical disc, a semiconductor storage device such as RAM, ROM, EPROM, flash memory or any other computer-readable tangible storage device that can store a computer program and digital information.

The modified transmitter DSP 900 may also include the R/W drive or interface 916 to read from and write to one or more portable computer readable storage media 928. Application programs 912 on said devices may be stored on one or more of the portable computer readable storage media 928, read via the respective R/W drive or interface 916 and loaded into the respective computer readable storage media 908.

It will be appreciated that in certain embodiments the application programs 912 stored on one or more of the portable computer readable storage media 928 may configure the modified transmitter DSP 900 to provide various functionalities, in accordance with various embodiments of the present disclosure.

The application programs 912 on the modified transmitter DSP 900 may be downloaded to the modified transmitter DSP 900 from an external computer or external storage device via a communication network (for example, the Internet, a local area network or other wide area network or wireless network) and network interface 918. From network interface 918, the programs may be loaded onto computer-readable storage media 908.

The modified transmitter DSP 900 may also include a display screen 922, a keyboard or keypad 924, and a computer mouse or touchpad 924. The device drivers 914 may interface to display screen 922 for imaging, to keyboard or keypad 924, to a computer mouse or touchpad 924, and/or to display screen 922 (in case of touch-screen display) for pressure sensing of alphanumeric character entry and user selections. The device drivers 914, R/W interface 916 and network interface 918 may comprise hardware and software (stored on computer-readable storage media 908 and/or ROM 906).

The programs described herein are identified based upon the application for which they are implemented in a particular embodiment of the present disclosure. However, it should be appreciated that any particular program nomenclature herein is used merely for convenience, and thus the disclosure should not be limited to use solely in any specific application identified and/or implied by such nomenclature.

It will be appreciated that the modified transmitter DSP 900 may be a server, a desktop computer, a laptop computer, a tablet, a smartphone, a personal digital assistant or any device that may be configured to implement the present technology, as should be understood by a person skilled in the art.

Figure 10:
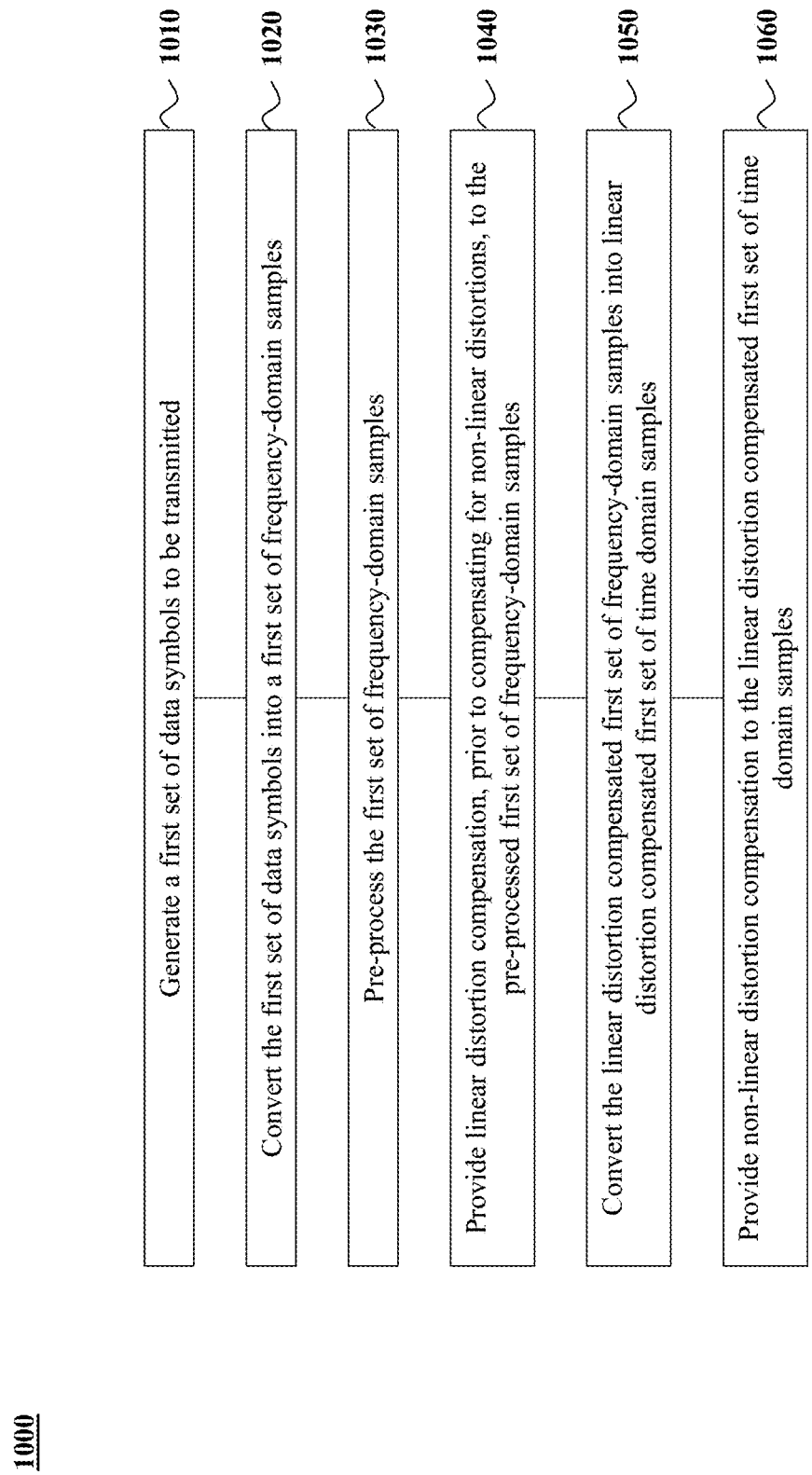
FIG. 10 illustrates a method for pre-compensating non-linear distortion in data samples in accordance with various embodiments of the present disclosure.

FIG. 10 illustrates a method for pre-compensating non-linear distortion in data samples in accordance with various embodiments of the present disclosure. On FIG. 10, a sequence 1000 comprises a plurality of operations, some of which may be executed in variable order, some of the operations possibly being executed concurrently, some of the operations being optional. At operation 1010, a first set of data symbols to be transmitted is generated. The first set of data symbols is converted into a first set of frequency-domain samples at operation 1020. At operation 1030, the first set of frequency-domain samples is pre-processed. Linear distortion compensation is provided to the pre-processed first set of frequency-domain samples at operation 1040, prior to compensating for non-linear distortions. At operation 1050, the linear distortion compensated first set of frequency-domain samples is converted into linear distortion compensated first set of time domain samples. Non-linear distortion compensation is provided to the linear distortion compensated first set of time domain samples at operation 1060.

In various embodiments, the sequence 1000 may also comprise generating a second set of data symbols in parallel to the first set of data symbols to be transmitted, converting the second set of data symbols into a second set of frequency-domain samples, pre-processing the second set of frequency-domain samples, combining the first set of frequency-domain samples and the second set of frequency-domain samples and generating a frequency-domain sampled DMB or OFDM signal, providing linear distortion compensation, prior to compensating for non-linear distortions, to the frequency-domain sampled DMB or OFDM signal, converting the linear distortion compensated frequency-domain sampled DMB or OFDM signal into linear distortion compensated time-domain sampled DMB or OFDM signal, and providing non-linear distortion compensation to the linear distortion compensated time-domain sampled DMB or OFDM signal.

In the same or other embodiments of the sequence 1000, the non-linear distortion compensation may be provided based on a Pattern Dependent Lookup Table (PDLUT). The PDLUT may be generated by receiving consecutive sequences of samples included in the linear distortion compensated first set of time domain samples, quantizing the consecutive sequences of samples into integer-valued consecutive sequences of samples, computing error correction values corresponding to the integer-valued consecutive sequences of samples, and storing the integer-valued consecutive sequences of samples and the corresponding error correction values in the PDLUT. Quantizing the consecutive sequences of samples may include clipping the consecutive sequences of samples, determining scaling factors based on quantization levels, and quantizing the consecutive sequences of samples based on the clipped consecutive sequences of samples and the scaling factors. Computing the error correction values may include receiving the consecutive sequences of samples received by a receiver, comparing the consecutive sequences of samples to be transmitted with the received consecutive sequences of samples, and computing the error correction values based on a difference between the consecutive sequences of samples to be transmitted and the received consecutive sequences of samples. In the event that more than one integer-valued consecutive sequences of samples are same and have different error correction values, one of the different error correction values may be selected. Selecting one of the different error correction values may include one of randomly selecting one of the different error correction values and taking an average of the different error correction values.

Figure 11:
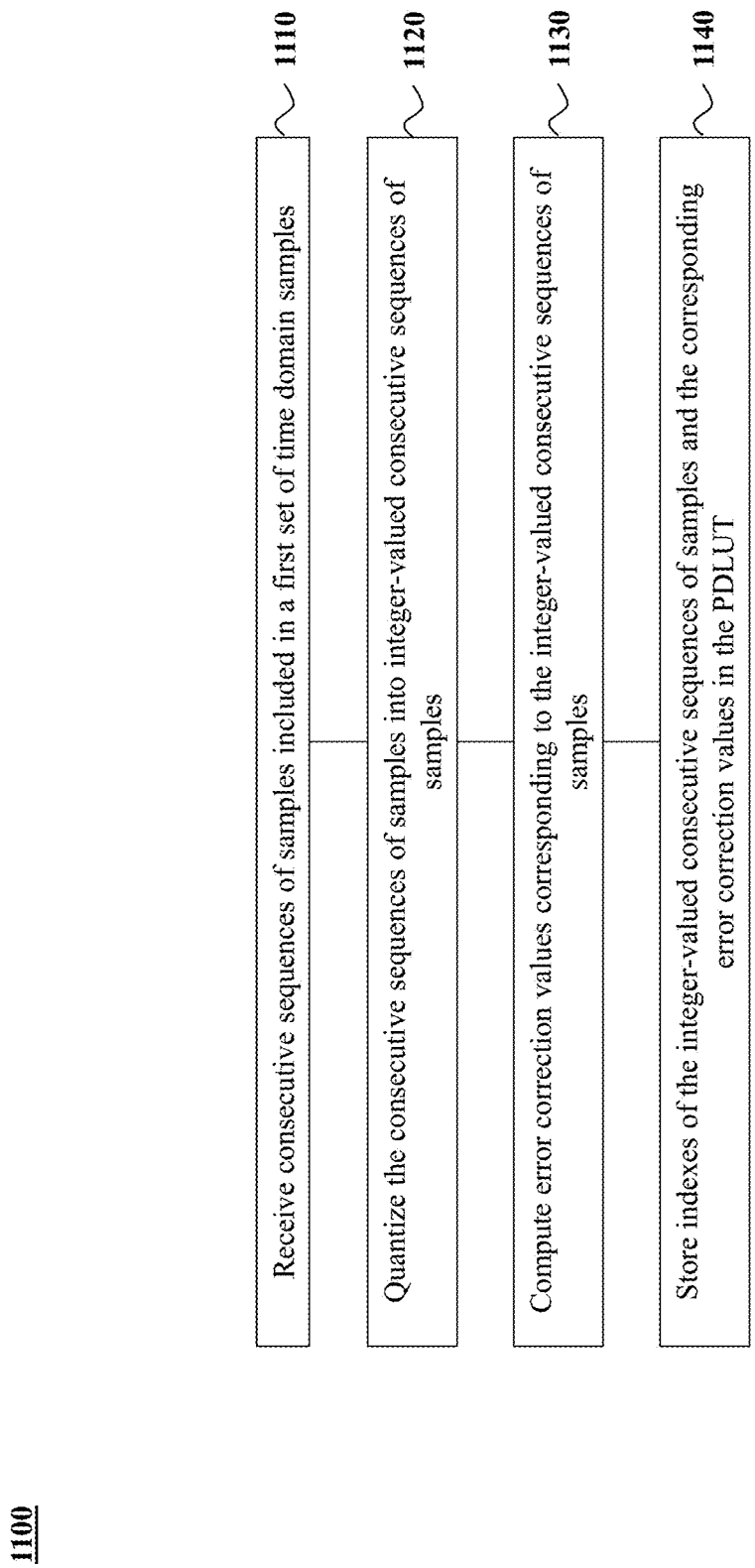
FIG. 11 illustrates a method for generating a Pattern Dependent Lookup Table (PDLUT) in accordance with various embodiments of the present disclosure.

FIG. 11 illustrates a method for generating a Pattern Dependent Lookup Table (PDLUT) in accordance with various embodiments of the present disclosure. On FIG. 11, a sequence 1100 comprises a plurality of operations, some of which may be executed in variable order, some of the operations possibly being executed concurrently, some of the operations being optional. Consecutive sequences of samples included in a first set of time domain samples are received at operation 1110. At operation 1120, the consecutive sequences of samples are quantized into integer-valued consecutive sequences of samples. Error correction values corresponding to the integer-valued consecutive sequences of samples are computed at operation 1130. At operation 1140, the integer-valued consecutive sequences of samples and the corresponding error correction values are stored in the PDLUT.

In various embodiments of the sequence 1100, quantizing the consecutive sequences of samples may include clipping the consecutive sequences of samples, determining scaling factors based on quantization levels, and quantizing the consecutive sequences of samples based on the clipped consecutive sequences of samples and the scaling factors. Computing the error correction values may include receiving the consecutive sequences of samples received by a receiver, comparing the consecutive sequences of samples to be transmitted with the received consecutive sequences of samples, and computing the error correction values based on a difference between the consecutive sequences of samples to be transmitted and the received consecutive sequences of samples. In the event that more than one integer-valued consecutive sequences of samples are same and have different error correction values, one of the different error correction values may be selected. Selecting one of the different error correction values may include one of randomly selecting one of the different error correction values and taking an average of the different error correction values.

It is to be understood that the operations and functionality of various systems and methods, constituent components, and associated processes may be achieved by any one or more of hardware-based, software-based, and firmware-based elements. Such operational alternatives do not, in any way, limit the scope of the present disclosure.

It will also be understood that, although the embodiments presented herein have been described with reference to specific features and structures, it is clear that various modifications and combinations may be made without departing from such disclosures. The specification and drawings are, accordingly, to be regarded simply as an illustration of the discussed implementations or embodiments and their principles as defined by the appended claims, and are contemplated to cover any and all modifications, variations, combinations or equivalents that fall within the scope of the present disclosure.

What is claimed is:

1. A system for pre-compensating non-linear distortion in data samples, the system comprising:
   a non-transitory memory element having instructions thereon;
   at least one processor coupled to the non-transitory memory element and which execute the instructions to cause the at least one processor to:
   generate a first set of data symbols to be transmitted;
   convert the first set of data symbols into a first set of frequency-domain samples;
   pre-process the first set of frequency-domain samples;
   provide linear distortion compensation, prior to compensating for non-linear distortions, to the pre-processed first set of frequency-domain samples;
   convert the linear distortion compensated first set of frequency-domain samples into linear distortion compensated first set of time domain samples; and
   provide non-linear distortion compensation to the linear distortion compensated first set of time domain samples, wherein the non-linear distortion compensation is provided based on a Pattern Dependent Lookup Table (PDLUT), wherein to generate the PDLUT, the at least one processor is configured to:
   receiving consecutive sequences of samples included in the linear distortion compensated first set of time domain samples;
   quantizing the consecutive sequences of samples into integer-valued consecutive sequences of samples;
   computing error correction values corresponding to the integer-valued consecutive sequences of samples; and
   storing the integer-valued consecutive sequences of samples and the corresponding error correction values in the PDLUT.

2. The system of claim 1, wherein the at least one processor is further configured to:
   generate a second set of data symbols in parallel to the first set of data symbols to be transmitted;
   convert the second set of data symbols into a second set of frequency-domain samples;
   pre-process the second set of frequency-domain samples;
   combine the first set of frequency-domain samples and the second set of frequency-domain samples and generate a frequency-domain sampled DMB or OFDM signal;
   provide linear distortion compensation, prior to compensating for non-linear distortions, to the frequency-domain sampled DMB or OFDM signal;
   convert the linear distortion compensated frequency-domain sampled DMB or OFDM signal into linear distortion compensated time-domain sampled DMB or OFDM signal; and
   provide non-linear distortion compensation to the linear distortion compensated time-domain sampled DMB or OFDM signal.

3. The system of claim 1, wherein quantizing the consecutive sequences of samples includes:
   clipping the consecutive sequences of samples;
   determining scaling factors based on quantization levels; and
   quantizing the consecutive sequences of samples based on the clipped consecutive sequences of samples and the scaling factors.

4. The system of claim 1, wherein computing the error correction values includes:
   receiving the consecutive sequences of samples received by a receiver; and
   comparing the consecutive sequences of samples to be transmitted with the received consecutive sequences of samples; and
   based on a difference between the consecutive sequences of samples to be transmitted and the received consecutive sequences of samples, computing the error correction values.

5. The system of claim 1, wherein in the event that more than one integer-valued consecutive sequences of samples are same and have different error correction values, selecting one of the different error correction values.

6. The system of claim 5, wherein selecting one of the different error correction values includes one of:
   randomly selecting one of the different error correction values; and
   taking an average of the different error correction values.

7. A method for pre-compensating non-linear distortion in data samples, the method comprising:
   generating a first set of data symbols to be transmitted;
   converting the first set of data symbols into a first set of frequency-domain samples;
   pre-processing the first set of frequency-domain samples;

providing linear distortion compensation, prior to compensating for non-linear distortions, to the pre-processed first set of frequency-domain samples;

converting the linear distortion compensated first set of frequency-domain samples into linear distortion compensated first set of time domain samples; and providing non-linear distortion compensation to the linear distortion compensated first set of time domain samples, wherein the non-linear distortion compensation is provided based on a Pattern Dependent Lookup Table (PDLUT) generated by:

receiving consecutive sequences of samples included in the linear distortion compensated first set of time domain samples;

quantizing the consecutive sequences of samples into integer-valued consecutive sequences of samples;

computing error correction values corresponding to the integer-valued consecutive sequences of samples; and storing the integer-valued consecutive sequences of samples and the corresponding error correction values in the PDLUT.

8. The method of claim 7, further comprising:

generating a second set of data symbols in parallel to the first set of data symbols to be transmitted;

converting the second set of data symbols into a second set of frequency-domain samples;

pre-processing the second set of frequency-domain samples;

combining the first set of frequency-domain samples and the second set of frequency-domain samples and generating a frequency-domain sampled DMB or OFDM signal;

providing linear distortion compensation, prior to compensating for non-linear distortions, to the frequency-domain sampled DMB or OFDM signal;

converting the linear distortion compensated frequency-domain sampled DMB or OFDM signal into linear distortion compensated time-domain sampled DMB or OFDM signal; and providing non-linear distortion compensation to the linear distortion compensated time-domain sampled DMB or OFDM signal.

9. The method of claim 8, wherein quantizing the consecutive sequences of samples includes:

clipping the consecutive sequences of samples;

determining scaling factors based on quantization levels; and quantizing the consecutive sequences of samples based on the clipped consecutive sequences of samples and the scaling factors.

10. The method of claim 8, wherein computing the error correction values includes:

receiving the consecutive sequences of samples received by a receiver;

comparing the consecutive sequences of samples to be transmitted with the received consecutive sequences of samples; and computing the error correction values based on a difference between the consecutive sequences of samples to be transmitted and the received consecutive sequences of samples.

11. The method of claim 8, wherein in the event that more than one integer-valued consecutive sequences of samples are same and have different error correction values, selecting one of the different error correction values.

12. The method of 11, wherein selecting one of the different error correction values includes one of:

randomly selecting one of the different error correction values; and taking an average of the different error correction values.

* * * * *